United States Patent
Mahurin et al.

(10) Patent No.: US 10,162,752 B2
(45) Date of Patent: Dec. 25, 2018

(54) DATA STORAGE AT CONTIGUOUS MEMORY ADDRESSES

(71) Applicant: QUALCOMM Incorporated, San Diego, CA (US)

(72) Inventors: Eric Mahurin, Austin, TX (US); David Hoyle, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 174 days.

(21) Appl. No.: 15/273,366

(22) Filed: Sep. 22, 2016

(65) Prior Publication Data

US 2018/0081803 A1  Mar. 22, 2018

(51) Int. Cl.

| G06F 12/00 | (2006.01) |
|---|---|
| G06F 12/06 | (2006.01) |
| G06F 9/30 | (2018.01) |
| G06F 9/38 | (2018.01) |
| G06F 12/02 | (2006.01) |
| G06F 12/1009 | (2016.01) |
| H03M 7/30 | (2006.01) |

(Continued)

(52) U.S. Cl.
CPC ...... *G06F 12/0676* (2013.01); *G06F 9/30036* (2013.01); *G06F 9/3802* (2013.01); *G06F 9/3887* (2013.01); *G06F 12/0215* (2013.01); *G06F 12/0292* (2013.01); *G06F 12/1009* (2013.01); *H03M 7/6011* (2013.01); *H03M 7/6023* (2013.01); *G06F 2212/656* (2013.01)

(58) Field of Classification Search
CPC ..... G06F 9/30036; G06F 9/3887; H03M 7/30
See application file for complete search history.

(56) References Cited

U.S. PATENT DOCUMENTS

| 4,881,168 A | * | 11/1989 | Inagami | ............ G06F 9/30043 708/520 |
| 6,490,264 B1 | | 12/2002 | Suzuki | |
| 7,463,586 B2 | | 12/2008 | Tanaka et al. | |

(Continued)

OTHER PUBLICATIONS

Ankur: "8086 Assembly Program to Search an Element in an Array," Internet Article, Jul. 10, 2015, XP002776899, Retrieved from the Internet: URL:http://ankurm.com/8086-assembly-program-to-search-an-element-in-an-array/ [retrieved on Oct. 25, 2017], 3 pages.

(Continued)

*Primary Examiner* — Mark A Giardino, Jr.
(74) *Attorney, Agent, or Firm* — Qualcomm Incorporated-Toler

(57) ABSTRACT

A method for storing data at contiguous memory addresses includes, at a single-instruction-multiple-data (SIMD) processor, executing a parallel-prefix valid count instruction to determine a first offset of a first data vector and to determine a second offset of a second data vector that includes valid data and invalid data. The second offset is based on the first offset and a number of positions in the first data vector that are associated with valid data. The method also includes storing first valid data from the first data vector at a first memory address of a memory and storing second valid data from the second data vector at a particular memory address of the memory. The first memory address is based on the first offset and the particular memory address is based on the second offset.

30 Claims, 6 Drawing Sheets

(51) Int. Cl.
*G06F 13/00* (2006.01)
*G06F 13/28* (2006.01)

(56) References Cited

U.S. PATENT DOCUMENTS

| | | | |
|---|---|---|---|
| 8,402,201 B2 | 3/2013 | Flynn et al. | |
| 8,559,465 B2 | 10/2013 | Brooks et al. | |
| 9,280,342 B2* | 3/2016 | Gove | G06F 9/30018 |
| 9,606,961 B2* | 3/2017 | Uliel et al. | G06F 15/8076 |
| 9,740,493 B2* | 8/2017 | Hughes | G06F 9/38 |
| 2014/0013076 A1* | 1/2014 | Ganesh | G06F 17/30315 712/4 |
| 2016/0085547 A1* | 3/2016 | Memon | G06F 9/30018 712/208 |
| 2016/0132243 A1 | 5/2016 | Batwara et al. | |
| 2017/0060587 A1* | 3/2017 | Chavan | G06F 9/30036 |

OTHER PUBLICATIONS

International Search Report and Written Opinion—PCT/US2017/044227—ISA/EPO—dated Jan. 8, 2018, 11 pages.
"Streaming SIMD Extensions," Wikipedia, Feb. 9, 2016, XP002774701, Retrieved from the Internet: URL:https://en.wikipedia.org/w/index.php?title=Streaming_SIMD_Extensions&oldid=704130503 [retrieved on Oct. 13, 2017], 5 pages.

* cited by examiner

|  | Position 0 | Position 1 | Position 2 | Position 3 | Position 4 | Position 5 | Position 6 | Position 7 |
|---|---|---|---|---|---|---|---|---|
| 132 → | - | A | - | B | - | - | C | - |
| 134 → | - | - | D | E | - | - | F | - |
| 136 → | G | - | - | - | H | I | - | J |

FIG. 2

|  | Position 7 | Position 6 | Position 5 | Position 4 | Position 3 | Position 2 | Position 1 | Position 0 |
|---|---|---|---|---|---|---|---|---|
| Data | - | C | - | - | B | - | A | - |
| Enable | 0 | 1 | 0 | 0 | 1 | 0 | 1 | 0 |
| Parallel Prefix | 3 | 3 | 2 | 2 | 2 | 1 | 1 | 0 |
| Memory Address | 3 | 3 | 2 | 2 | 2 | 1 | 1 | 0 |
| Data | - | F | - | - | E | D | - | - |
| Enable | 0 | 1 | 0 | 0 | 1 | 1 | 0 | 0 |
| Parallel Prefix | 3 | 3 | 2 | 2 | 2 | 1 | 0 | 0 |
| Memory Address | 6 | 6 | 5 | 5 | 5 | 4 | 3 | 3 |
| Data | J | - | I | H | - | - | - | G |
| Enable | 1 | 0 | 1 | 1 | 0 | 0 | 0 | 1 |
| Parallel Prefix | 4 | 3 | 3 | 2 | 1 | 1 | 1 | 1 |
| Memory Address | 10 | 9 | 9 | 8 | 7 | 7 | 7 | 7 |

*FIG. 4*

DATA STORAGE AT CONTIGUOUS MEMORY ADDRESSES

I. FIELD

The present disclosure is generally related to data storage.

II. DESCRIPTION OF RELATED ART

Advances in technology have resulted in more powerful computing devices. For example, computing devices such as laptop and desktop computers and servers, as well as wireless computing devices such as portable wireless telephones, personal digital assistants (PDAs), and paging devices, have improved computing capabilities and are able to perform increasingly complex operations. Increased computing capabilities have also enhanced device capabilities in various other applications. For example, vehicles may include processing devices to enable global positioning system operations or other location operations, self-driving operations, interactive communication and entertainment operations, etc. Other examples include household appliances, security cameras, metering equipment, etc., that also incorporate computing devices to enable enhanced functionality, such as communication using the internet-of-things.

A computing device may include a processor that is operable to process one or more sparse data vectors. As used herein, a "sparse data vector" is a vector of data that includes data elements having invalid data (e.g., "don't care" data values, default data values, null data values, or zero data values) and data elements having valid data (e.g., data values "of interest"). Invalid data in a data vector leads to inefficient computation and storage. For example, because sparse data vectors include data elements having invalid data items that do not have to be processed, components (e.g., hardware) included in the processor may be inefficiently used by processing the invalid data.

One technique for improving hardware usage efficiency includes compressing a sparse data vector within a processing pipeline of the processor to generate a compressed data vector. To generate the compressed data vector, the processor may shift data (within the processing pipeline of the processor) such that data elements having valid data are adjacent to one another and data elements having invalid data are adjacent to one another. However, generating compressed data vectors within the processing pipeline may result in a relatively large number of data vectors with complex addressing schemes. Additionally, generating compressed data vectors within the processing pipeline may result in increased hardware costs.

III. SUMMARY

According to one implementation of the techniques disclosed herein, a method includes, at a single-instruction-multiple-data (SIMD) processor, executing a parallel-prefix valid count instruction to determine a first offset associated with a first valid position in a sequence of data elements that includes valid data and invalid data. Executing the parallel-prefix valid count instruction also causes the SIMD processor to determine a second offset associated with a second valid position in the sequence of data elements. The second offset is based on the first offset and a number of positions in the sequence of data elements that are associated with valid data.

According to another implementation of the techniques disclosed herein, an apparatus includes a memory and a single-instruction-multiple-data (SIMD) configured to execute a parallel-prefix valid count instruction. Executing the parallel-prefix valid count instruction enables the SIMD processor to determine a first offset associated with a first valid position in a sequence of data elements that includes valid data and invalid data and determine a second offset associated with a second valid position in the sequence of data elements. The second offset is based on the first offset and a number of positions in the sequence of data elements that are associated with valid data.

According to another implementation of the techniques disclosed herein, a non-transitory computer-readable medium includes at least one instruction that, when executed by single-instruction-multiple-data (SIMD) processor, causes the SIMD processor to perform operations including determining, by execution of a parallel-prefix valid count instruction, a first offset associated with a first valid position in a sequence of data elements that includes valid data and invalid data. The operations also include determining, by execution of the parallel-prefix valid count instruction, a second offset associated with a second valid position in the sequence of data elements. The second offset is based on the first offset and a number of positions in the sequence of data elements that are associated with valid data.

According to another implementation of the techniques disclosed herein, an apparatus includes means for determining a first offset associated with a first valid position in a sequence of data elements that includes valid data and invalid data. The apparatus also includes means for determining a second offset associated with a second valid position in the sequence of data elements. The second offset is based on the first offset and a number of positions in the sequence of data elements that are associated with valid data.

IV. BRIEF DESCRIPTION OF THE DRAWINGS

FIG. 2 illustrates sparse data vectors that include valid data and invalid data;

FIG. 4 illustrates a chart for identifying an offset of valid data values in a compressed memory data vector;

V. DETAILED DESCRIPTION

Figure 1:
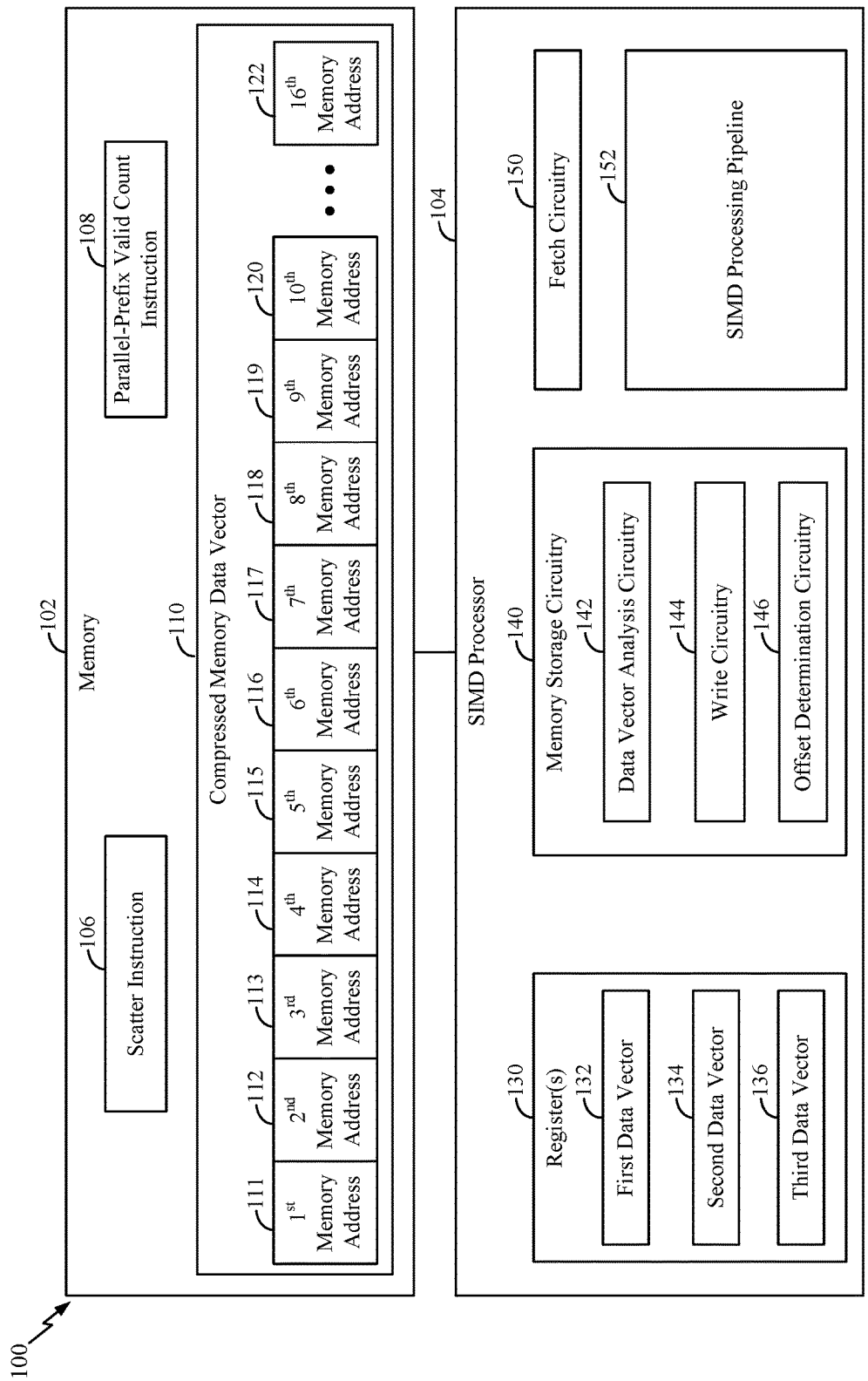
FIG. 1 is a diagram of a system that is operable to store data at contiguous memory addresses.

Referring to FIG. 1, a system 100 that is operable to store data at contiguous memory addresses is shown. The system 100 may be implemented within a mobile phone, a personal digital assistant (PDA), an entertainment unit, a navigation device, a music player, a video player, a digital video player, a digital video disc (DVD) player, or any other device.

The system 100 includes a memory 102 that is coupled to a processor 104. According to one implementation, the processor 104 may include a single-instruction-multiple-data (SIMD) processor. The memory 102 may be a non-transitory computer-readable medium that includes instructions that are executable by the processor 104. For example, the memory 102 includes a scatter instruction 106 that is executable by the processor 104 and a parallel-prefix valid count instruction 108 that is executable by the processor 104.

The memory 102 also includes a compressed memory data vector 110. As described below, valid data (as opposed to invalid data) from different sparse data vectors may be stored at the compressed memory data vector 110 to generate a "compressed data vector" in the memory 102. The compressed memory data vector 110 includes a plurality of contiguous memory addresses. To illustrate, the compressed memory data vector 110 includes a first memory address 111, a second memory address 112 that is contiguous to the first memory address 111, a third memory address 113 that is contiguous to the second memory address 112, a fourth memory address 114 that is contiguous to the third memory address 113, a fifth memory address 115 that is contiguous to the fourth memory address 114, a sixth memory address 116 that is contiguous to the fifth memory address 115, a seventh memory address 117 that is contiguous to the sixth memory address 116, an eighth memory address 118 that is contiguous to the seventh memory address 117, a ninth memory address 119 that is contiguous to the eighth memory address 118, a tenth memory address 120 that is contiguous to the ninth memory address 119, etc.

In FIG. 1, the compressed memory data vector 110 includes sixteen memory addresses. For example, the compressed memory data vector 110 includes a sixteenth memory address 122 that is contiguous to a fifteenth memory address (not shown). However, in other implementations, the compressed memory data vector 110 may include additional (or fewer) contiguous memory addresses. As a non-limiting example, the compressed memory data vector 110 may include thirty-two contiguous memory addresses.

The processor 104 includes one or more registers 130, memory storage circuitry 140, fetch circuitry 150, and a SIMD processing pipeline 152. Although the one or more registers 130 are shown to be included in the processor 104, in other implementations, the one or more registers 130 may be separate from (and accessible to) the processor 104. In other implementations, the processor 104 may include additional (or fewer) components. As a non-limiting example, in other implementations, the processor 104 may also include one or more arithmetic logic units (ALUs), one or more application-specific execution units, etc. Although the processor 104 is shown to include the memory storage circuitry 140, the fetch circuitry 150, and the SIMD processing pipeline 152, in other implementations, operations of each component 140, 150, 152 may be performed by a single processing component.

The one or more registers 130 may store a first data vector 132, a second data vector 134, and a third data vector 136. A "sequence of data elements" may include the data elements stored in the data vectors 132, 134, 136. Although three data vectors 132, 134, 136 are shown to be included in the one or more registers 130, in other implementations, the one or more registers 130 may include additional (or fewer) data vectors. Each data vector 132, 134, 136 may be a "sparse data vector" or a "sparse data array." For example, each data vector 132, 134, 136 may include valid data (e.g., data values of interest) and invalid data (e.g., "don't care" data values, default data values, or zero data values). According to one implementation, the data vectors 132, 134, 136 may be stored in the memory 102 (as opposed to being stored in the one or more registers 130).

Referring to FIG. 2, the data vectors 132, 134, 136 are shown in greater detail. Each data vector 132, 134, 136 includes eight positions (e.g., "Position 0" to "Position 7"). According to one implementation, each position may correspond to an "array position". Although each data vector 132, 134, 136 is shown to include eight positions, in other implementations, each data vector 132, 134, 136 may include additional (or fewer) positions. As a non-limiting example, each data vector 132, 134, 136 may include sixteen positions. According to another implementation, different data vectors may include a different number of positions. As a non-limiting example, one data vector may include eight positions and another data vector may include sixteen positions.

According to FIG. 2, the first data vector 132 includes three valid data values and five invalid data values. For example, "Position 1" of the first data vector 132 stores valid data value "A", "Position 3" of the first data vector 132 stores valid data value "B", and "Position 6" of the first data vector 132 stores valid data value "C". The other positions of the first data vector 132 store invalid data values. The second data vector 134 also includes three valid data values and five invalid data values. For example, "Position 2" of the second data vector 134 stores valid data value "D", "Position 3" of the second data vector 134 stores valid data value "E", and "Position 6" of the second data vector 134 stores valid data value "F". The other positions of the second data vector 134 store invalid data values. The third data vector 136 includes four valid data values and four invalid data values. For example, "Position 0" of the third data vector 136 stores valid data value "G", "Position 4" of the third data vector 136 stores valid data value "H", "Position 5" of the third data vector 136 stores valid data value "I", and "Position 7" of the third data vector 136 stores valid data value "J". The other positions of the third data vector 136 store invalid data values.

Referring back to FIG. 1, the memory storage circuitry 140 includes data vector analysis circuitry 142, write circuitry 144, and offset determination circuitry 146. The data vector analysis circuitry 142 may be configured to determine whether the first data vector 132 includes positions having valid data. For example, the data vector analysis circuitry 142 may determine that valid data value "A" is located at "Position 1" of the first data vector 132 (e.g., the first sequential position having valid data). The write circuitry 144 may be configured to write (e.g., store) valid data values (in parallel) at the contiguous memory addresses of the compressed memory data vector 110. For example, in response to a determination that valid data value "A" is located at "Position 1" of the first data vector 132, the memory storage circuitry 140 may enable the write circuitry 144. The write circuitry 144 may store valid data value "A" at the first memory address 111 in response to being enabled. For example, the write circuitry 144 may execute the scatter instruction 106 (e.g., a vector store instruction) to store valid data value "A" at the first memory address 111.

After valid data value "A" is stored at the first memory address 111, the data vector analysis circuitry 142 may determine whether the first data vector 132 includes another position having valid data. For example, the data vector analysis circuitry 142 may determine that valid data value "B" is located at "Position 3" of the first data vector 132 (e.g., the next sequential position having valid data). In response to a determination that valid data value "B" is located at "Position 3" of the first data vector 132, the memory storage circuitry 140 may enable the write circuitry 144. The write circuitry 144 may store valid data value "B" at the second memory address 112 (e.g., a contiguous memory address of the first memory address 111) in response to being enabled. For example, the write circuitry 144 may execute the scatter instruction 106 to store valid data value "B" at the second memory address 112.

After valid data value "B" is stored at the second memory address 112, the data vector analysis circuitry 142 may determine whether the first data vector 132 includes another position having valid data. For example, the data vector analysis circuitry 142 may determine that valid data value "C" is located at "Position 6" of the first data vector 132 (e.g., the next sequential position having valid data). In response to a determination that valid data value "C" is located at "Position 6" of the first data vector 132, the memory storage circuitry 140 may enable the write circuitry 144. The write circuitry 144 may store valid data value "C" at the third memory address 113 (e.g., a contiguous memory address of the second memory address 112) in response to being enabled. For example, the write circuitry 144 may execute the scatter instruction 106 to store valid data value "C" at the third memory address 113. Thus, the invalid data values of the first data vector 132 may be bypassed and the valid data values of the first data vector 132 may be stored at contiguous memory addresses in the memory 102.

After valid data value "C" is stored at the third memory address 113, the data vector analysis circuitry 142 may determine whether the first data vector 132 includes another position having valid data. In response to a determination that the first data vector 132 does not include another position having valid data, the data vector analysis circuitry 142 may determine whether the second data vector 134 includes a position having valid data. For example, the data vector analysis circuitry 142 may determine that valid data value "D" is located at "Position 2" of the second data vector 134 (e.g., the first sequential position having valid data). In response to a determination that valid data value "D" is located at "Position 2" of the second data vector 134, the memory storage circuitry 140 may enable the write circuitry 144. The write circuitry 144 may store valid data value "D" at the fourth memory address 114 (e.g., a contiguous memory address of the third memory address 113) in response to being enabled. For example, the write circuitry 144 may execute the scatter instruction 106 to store valid data value "D" at the fourth memory address 114.

After valid data value "D" is stored at the fourth memory address 114, the data vector analysis circuitry 142 may determine whether the second data vector 134 includes another position having valid data. For example, the data vector analysis circuitry 142 may determine that valid data value "E" is located at "Position 3" of the second data vector 134 (e.g., the next sequential position having valid data). In response to a determination that valid data value "E" is located at "Position 3" of the second data vector 134, the memory storage circuitry 140 may enable the write circuitry 144. The write circuitry 144 may store valid data value "E" at the fifth memory address 115 (e.g., a contiguous memory address of the fourth memory address 114) in response to being enabled. For example, the write circuitry 144 may execute the scatter instruction 106 to store valid data value "E" at the fifth memory address 115.

After valid data value "E" is stored at the fifth memory address 115, the data vector analysis circuitry 142 may determine whether the second data vector 134 includes another position having valid data. For example, the data vector analysis circuitry 142 may determine that valid data value "F" is located at "Position 6" of the second data vector 134 (e.g., the next sequential position having valid data). In response to a determination that valid data value "F" is located at "Position 6" of the second data vector 134, the memory storage circuitry 140 may enable the write circuitry 144. The write circuitry 144 may store valid data value "F" at the sixth memory address 116 (e.g., a contiguous memory address of the fifth memory address 115) in response to being enabled. For example, the write circuitry 144 may execute the scatter instruction 106 to store valid data value "F" at the sixth memory address 116. Thus, the invalid data values of the second data vector 134 may be bypassed and the valid data values of the second data vector 134 may be stored at contiguous memory addresses in the memory 102.

After valid data value "F" is stored at the sixth memory address 116, the data vector analysis circuitry 142 may determine whether the second data vector 134 includes another position having valid data. In response to a determination that the second data vector 134 does not include another position having valid data, the data vector analysis circuitry 142 may determine whether the third data vector 136 includes a position having valid data. For example, the data vector analysis circuitry 142 may determine that valid data value "G" is located at "Position 1" of the third data vector 136 (e.g., the first sequential position having valid data). In response to a determination that valid data value "G" is located at "Position 1" of the third data vector 136, the memory storage circuitry 140 may enable the write circuitry 144. The write circuitry 144 may store valid data value "G" at the seventh memory address 117 (e.g., a contiguous memory address of the sixth memory address 116) in response to being enabled. For example, the write circuitry 144 may execute the scatter instruction 106 to store valid data value "G" at the seventh memory address 117.

After valid data value "G" is stored at the seventh memory address 117, the data vector analysis circuitry 142 may determine whether the third data vector 136 includes another position having valid data. For example, the data vector analysis circuitry 142 may determine that valid data value "H" is located at "Position 4" of the third data vector 136 (e.g., the next sequential position having valid data). In response to a determination that valid data value "H" is located at "Position 4" of the third data vector 136, the memory storage circuitry 140 may enable the write circuitry 144. The write circuitry 144 may store valid data value "H" at the eighth memory address 118 (e.g., a contiguous memory address of the seventh memory address 117) in response to being enabled. For example, the write circuitry 144 may execute the scatter instruction 106 to store valid data value "H" at the eighth memory address 118.

After valid data value "H" is stored at the eighth memory address 118, the data vector analysis circuitry 142 may determine whether the third data vector 136 includes another position having valid data. For example, the data vector analysis circuitry 142 may determine that valid data value "I" is located at "Position 5" of the third data vector 136 (e.g., the next sequential position having valid data). In response to a determination that valid data value "I" is located at "Position 5" of the third data vector 136, the memory storage circuitry 140 may enable the write circuitry 144. The write circuitry 144 may store valid data value "I" at the ninth memory address 119 (e.g., a contiguous memory address of the eighth memory address 118) in response to being enabled. For example, the write circuitry 144 may execute the scatter instruction 106 to store valid data value "I" at the ninth memory address 119.

After valid data value "J" is stored at the ninth memory address 119, the data vector analysis circuitry 142 may determine whether the third data vector 136 includes another position having valid data. For example, the data vector analysis circuitry 142 may determine that valid data value "J" is located at "Position 7" of the third data vector 136 (e.g., the next sequential position having valid data). In response to a determination that valid data value "J" is located at "Position 7" of the third data vector 136, the memory storage circuitry 140 may enable the write circuitry 144. The write circuitry 144 may store valid data value "J" at the tenth memory address 120 (e.g., a contiguous memory address of the ninth memory address 119) in response to being enabled. For example, the write circuitry 144 may execute the scatter instruction 106 to store valid data value "J" at the tenth memory address 120. Thus, the invalid data values of the third data vector 136 may be bypassed and the valid data values of the third data vector 136 may be stored at contiguous memory addresses in the memory 102.

Figure 3:
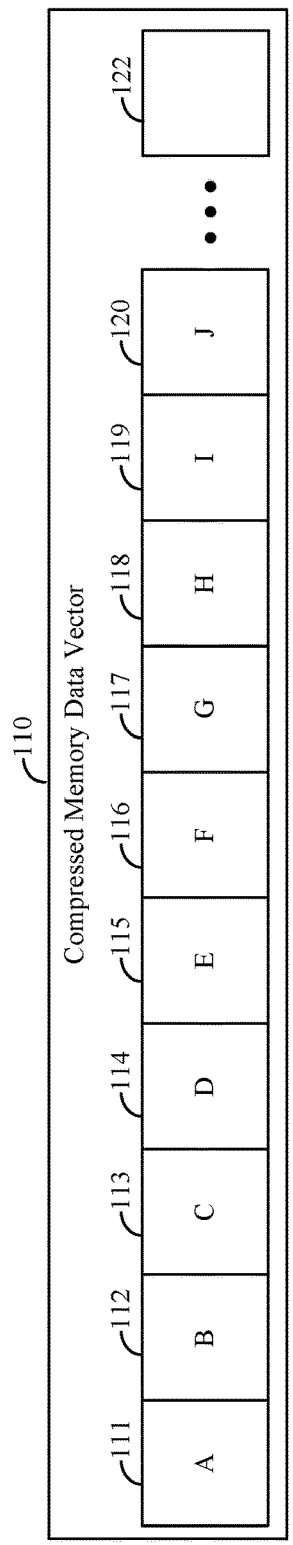
FIG. 3 illustrates a compressed memory data vector.

Similar operations may be performed to store additional valid data values to the compressed memory data vector 110 of the memory 102. Referring to FIG. 3, the compressed memory data vector 110 is shown after completion of the store operations described above. Each valid data value of the data vectors 132, 134, 136 may be stored at contiguous memory addresses of the compressed memory data vector 110. Thus, invalid data may be separated from the sparse data vectors 132, 134, 136 to generate the compressed memory data vector 110 having valid data at each memory address. As described below, the processor 150 may fetch the compressed memory data vector 110 from the memory 102 to process valid data as opposed to processing valid data and invalid data, which may result in inefficient use of the processor 104.

Referring back to FIG. 1, the offset determination circuitry 146 may be configured to determine (e.g., count) an offset for each data vector 132, 134, 136 with respect to the compressed memory data vector 110. For example, the offset determination circuitry 146 may determine a count (e.g., a parallel-prefix valid count) of write enables for each data vector 132, 134, 136. The offset for each data vector 132, 134, 136 may be based on the parallel-prefix valid count. The "offset" for a particular data vector is the first sequential memory address of the compressed memory data vector 110 where valid data associated with the particular data vector is stored. The offset determination circuitry 146 may generate multiple offsets 160 corresponding to the data vectors 132-136, including a first offset 162 of the first data vector 132, a second offset 164 of the second data vector 134, and a third offset 166 of the third data vector 136. For example, as described further with reference to FIG. 4, the first offset 162 may have a value of "1" to indicate that valid data of the first data vector 132 begins at the first memory address 111 of the compressed memory data vector 110, the second offset 164 may have a value of "4" to indicate that valid data of the second data vector 134 begins at the fourth memory address 114, and the third offset 166 may have a value of "7" to indicate that the valid data of the third data vector 136 begins at the seventh memory address 117 of the of the compressed memory data vector 110. According to one implementation, the processor 104 may execute the parallel-prefix valid count instruction 108 to determine the offset.

To illustrate, a chart 400 for identifying the offset for each data vector 132, 134, 136 is shown in FIG. 4. According to the chart 400, memory address "0" may be used as the base address for the first data vector 132. A parallel prefix count of the first data vector 132 may increase (from zero to one) in response to an enable (e.g., a write enable) associated with storing valid data value "A" at the compressed memory data vector 110. Each time the parallel prefix count increases, the memory address also increases. Thus, under the "Position 1" column in the chart 400, the memory address increases from memory address "0" to memory address "1" (e.g., the first memory address 111). Thus, the offset 162 for the first data vector 132 with respect to the compressed memory data vector 110 is the first memory address 111 and may be stored as having an offset value of "1" to indicate the first memory address 111. In other implementations, the offset 162 may be stored having another offset value that indicates the first memory address 111, such as an offset value of "0" in a zero-based indexing implementation.

The parallel prefix count may increase (from one to two) in response to an enable associated with storing valid data value "B" at the second memory address 112 of the compressed memory data vector 110. The parallel prefix count may also increase (from two to three) in response to an enable associated with storing valid data value "C" at the third memory address 113 of compressed memory data vector 110. As described above, the address of the last valid data value stored may be used as the based for a new data vector. Because memory address "3" (e.g., the third memory address 113) is the address of the last data value (e.g., valid data value "C") stored, the third memory address 113 may be used as the base for the second data vector 134. When the parallel-prefix count of the second data vector 134 increases (from zero to one), the corresponding memory address may be the offset 164 for the second data vector 134. Thus, the offset 164 for the second data vector 134 with respect to the compressed memory data vector 110 is the fourth memory address 114 and may be represented as having an offset value of "4" (or "3" in a zero-based indexing implementation). In a similar manner, according to the chart 400, the offset 166 for the third data vector 136 with respect to the compressed memory data vector 110 is the seventh memory address 117 and may be represented as having an offset value of "7" (or "6" in a zero-based indexing implementation).

Referring back to FIG. 1, the offsets (determined by the offset determination circuitry 146) may be used to map data in the memory 102 to the data vectors 132, 134, 136. For example, the processor 104 may determine that the first, second, and third memory addresses 111, 112, 113 include data associated with the first data vector 132 if the offset 162 of the first data vector 132 is the first memory address 111 and the offset 164 of the second data vector 134 is the fourth memory address 114. Similarly, the processor 104 may determine that the fourth, fifth, and sixth memory addresses 114, 115, 116 include data associated with the second data vector 134 if the offset 164 of the second data vector 134 is the fourth memory address 114 and the offset 166 of the third data vector 136 is the seventh memory address 117.

After the data values are stored in the compressed memory data vector 110, the fetch circuitry 150 may be configured to fetch the data stored in the compressed memory data vector 110. The fetch circuitry 150 may provide the compressed memory data vector 110 to the SIMD processing pipeline 152. Because each memory address of the compressed memory data vector 110 includes valid data values, the processing components and hardware in the SIMD processing pipeline 152 may be efficiently used. For example, processing components in the SIMD processing pipeline 152 may be used on valid data values as opposed to being used for invalid data values.

The techniques described with respect to FIGS. 1-4 may improve processing efficiency by reducing the amount of invalid data values that are processed by the SIMD processing pipeline 152. By storing valid data values at contiguous addresses in the memory 102, the fetch circuitry 150 may provide valid data values (as opposed to valid and invalid data values) to the SIMD processing pipeline 152. Additionally, a relatively simple addressing scheme may be achieved by tracking the parallel-prefix valid count for each data vector 132, 134, 136 during the storage process. For example, the processor 104 may identify which data values and/or memory addresses correspond to each data vector 132, 134, 136 based on the parallel-prefix valid count.

As described with reference to FIGS. 1-4, the parallel-prefix valid count instruction 108 may be used during compression of sparse data from the multiple data vectors 132-136 to a dense data arrangement in the compressed memory data vector 110. Alternatively, or in addition, the parallel-prefix valid count instruction 108 may be used during decompression of the data from the compressed memory data vector 110 to a sparse data arrangement in the data vectors 132-136. For example, after compressing the data into the compressed memory data vector 110, the data in the compressed memory data vector 110 may be processed by the SIMD processing pipeline 152 to generate modified data in the compressed memory data vector 110. The modified data may be written back to the corresponding positions of the data vectors 132-136 to overwrite the original valid data with the modified data. In a decompression operation, a contiguous offset or address for each valid position in the data vectors 132-136 may be computed using the parallel-prefix valid count instruction 108 with accumulation from the last count of the prior vector, as described in FIG. 4. A load/gather may be performed to load the data from each address or offset in the compressed memory data vector 110 into the valid data positions of the data vectors 132-136 based on the results of the parallel-prefix valid count instruction 108. Thus, the parallel-prefix valid count instruction 108 may be used during data compression operations and also during data decompression operations.

Figure 5:
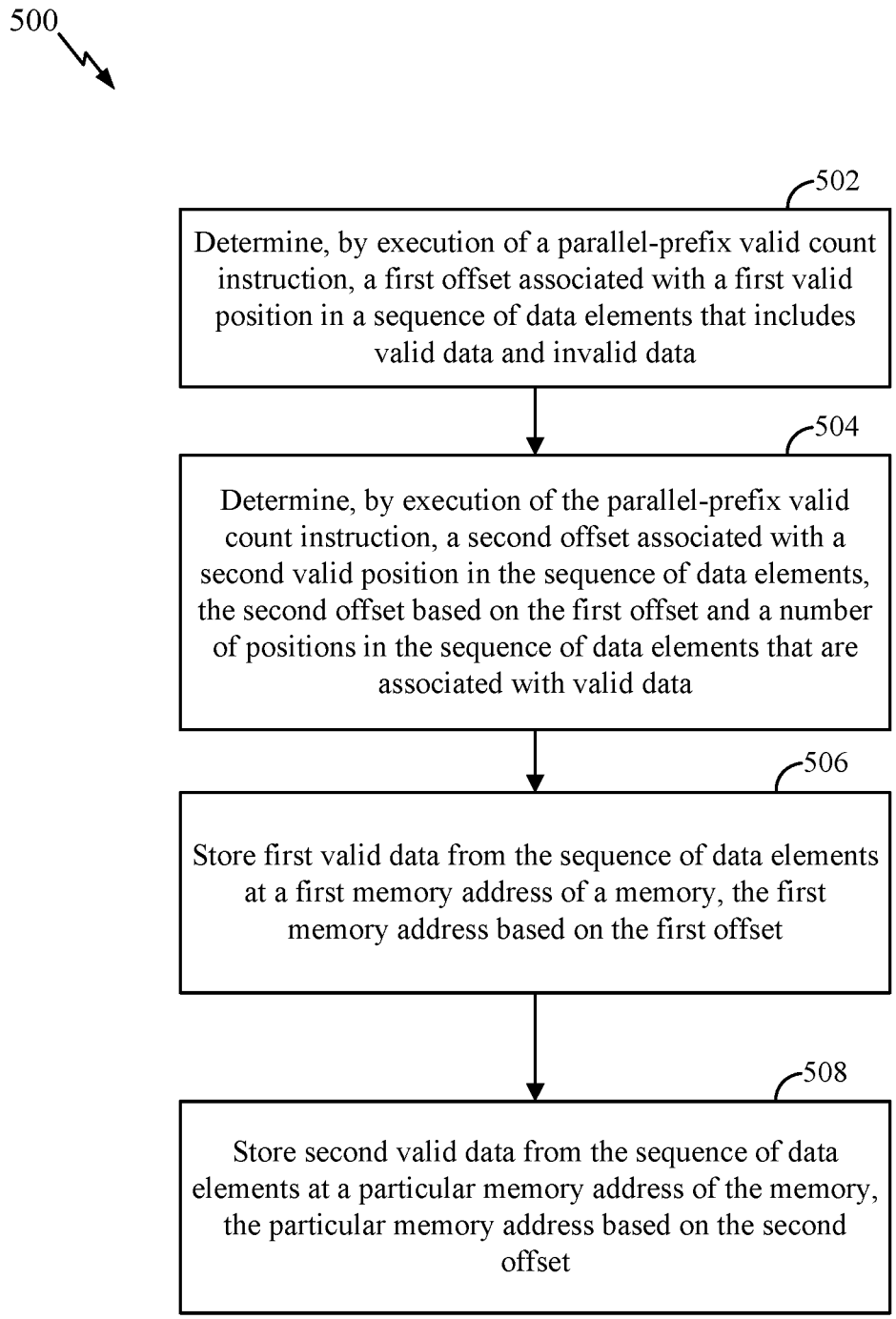
FIG. 5 illustrates a method for storing data at contiguous memory addresses.

Referring to FIG. 5, a flowchart of a method 500 for storing data at contiguous memory addresses is shown. The method 500 may be performed using the system 100 of FIG. 1.

The method 500 includes determining, by execution of a parallel-prefix valid count instruction, a first offset associated with a first valid position in a sequence of data elements that includes valid data and invalid data, at 502. For example, referring to FIG. 1, the SIMD processor 104 may execute the parallel-prefix valid count instruction 108 to determine the first offset 162 of the first data vector 132.

The method 500 also includes determining, by execution of the parallel-prefix valid count instruction, a second offset associated with a second valid position in the sequence of data elements, at 504. The second offset may be based on the first offset and a number of positions in the sequence of data elements that are associated with valid data. For example, referring to FIG. 1, the SIMD processor 104 may execute the parallel-prefix valid count instruction 108 to determine the second offset 164 of the second data vector 134. According to one implementation, the second offset may be computed by adding the number of positions in the first data vector 132 that are associated with valid data to the first offset 162.

The method 500 also includes storing first valid data from the first data vector at a first memory address of a memory, at 506. The first memory address may be based on the first offset. For example, referring to FIG. 1, in response to a determination that valid data value "A" is located at "Position 1" of the first data vector 132, the memory storage circuitry 140 may enable the write circuitry 144. The write circuitry 144 may store valid data value "A" at the first memory address 111 in response to being enabled. For example, the write circuitry 144 may execute the scatter instruction 106 to store valid data value "A" at the first memory address 111.

The method 500 also includes storing second valid data from the second data vector at a particular memory address of the memory, at 508. The particular memory address may be based on the second offset. For example, referring to FIG. 1, the memory storage circuitry 140 may enable the write circuitry 144. The write circuitry 144 may store valid data value "D" at the fourth memory address 114 (e.g., the "second memory address" according to the method 500) in response to being enabled. For example, the write circuitry 144 may execute the scatter instruction 106 to store valid data value "D" at the fourth memory address 114.

According to one implementation, the method 500 may include storing additional valid data from the first data vector at additional sequential memory addresses that are contiguous to the first memory address of the memory. The particular memory address (where the second valid data is stored) may be contiguous to a last memory address of the additional sequential memory address. According to one implementation of the method 500, the first valid data and the second valid data may be stored in parallel. For example, storing the second valid data in parallel with the first valid data includes storing the first valid data during a first time period (e.g., during a single clock cycle of the SIMD processor 104) and concurrently storing the second valid data during the first time period.

According to one implementation of the method 500, the first memory address and the particular memory address may be memory addresses of a compressed memory data vector (e.g., the compressed memory data vector 110). The method 500 may also include fetching data stored at the compressed memory data vector and processing the data stored at the compressed memory data vector in response to fetching the data stored at the compressed memory data vector.

According to one implementation of the method 500, after processing the data stored at the compressed memory data vector, a "decompression" operation may be performed. The parallel-prefix valid count instruction may be executed to determine offsets that map positions of processed data in contiguous memory to positions of valid data in a sparse sequence of data. The processed data may then be loaded from the contiguous memory to the positions of valid data in the sparse sequence of data. Thus, the compressed arrangement of processed data in the contiguous memory may be decompressed to a sparse arrangement of the processed data based on positions of valid data in the data vectors 132-136.

The method 500 of FIG. 5 may improve processing efficiency by reducing the amount of invalid data values that are processed by the SIMD processing pipeline 152. By storing valid data values at contiguous addresses in the memory 102, the fetch circuitry 150 may provide valid data values (as opposed to valid and invalid data values) to the SIMD processing pipeline 152. Additionally, a relatively simple addressing scheme may be achieved by tracking the parallel-prefix valid count for each data vector 132, 134, 136 during the storage process. For example, the processor 104 may identify which data values and/or memory addresses correspond to each data vector 132, 134, 136 based on the parallel-prefix valid count.

Figure 6:
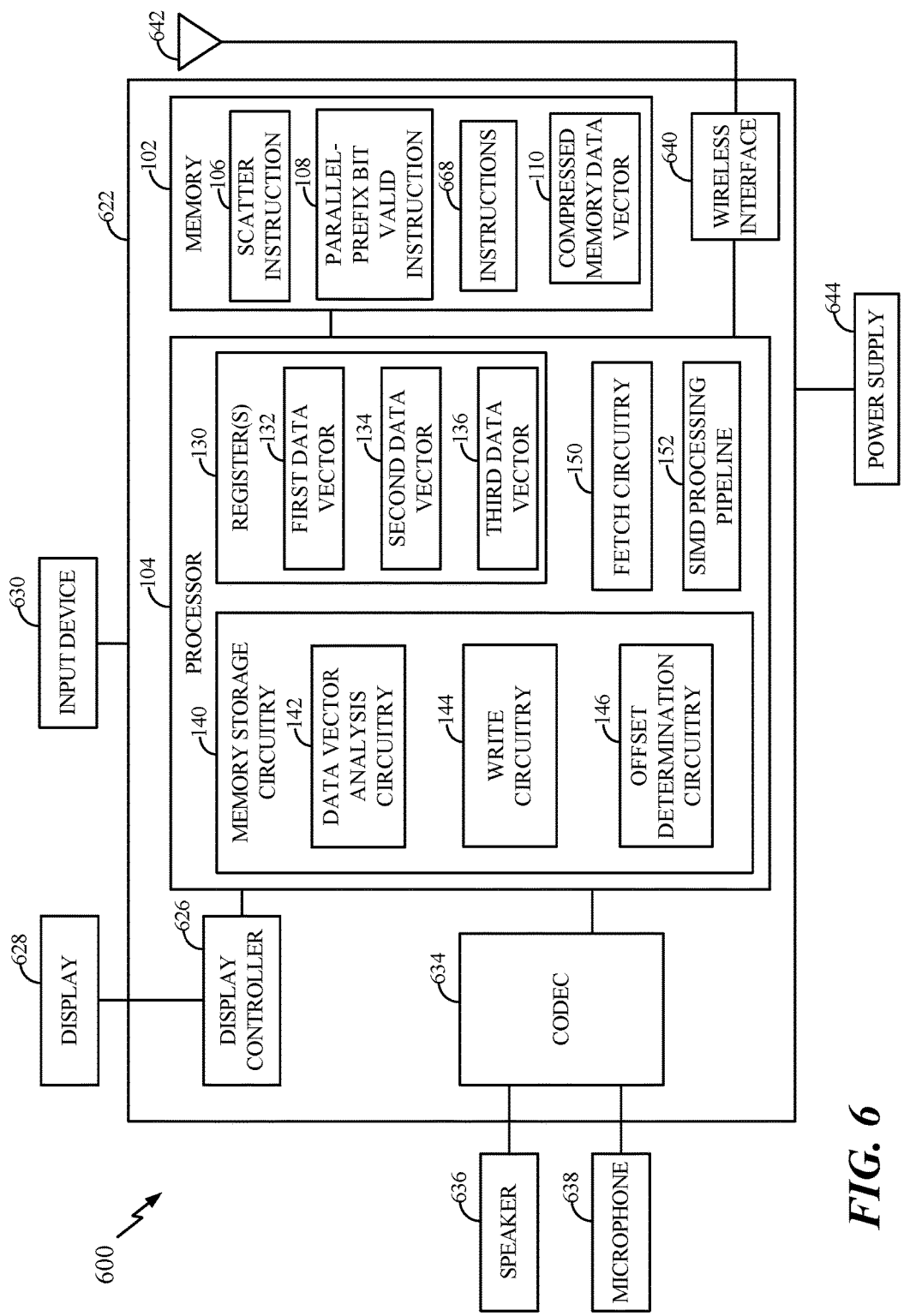
FIG. 6 is a diagram of an electronic device that includes components operable to store data at contiguous memory addresses.

Referring to FIG. 6, a block diagram of an electronic device 600 is shown. The electronic device 600 may correspond to a mobile device (e.g., a cellular telephone), as an illustrative example. In other implementations, the electronic device 600 may correspond to a computer (e.g., a server, a laptop computer, a tablet computer, or a desktop computer), a wearable electronic device (e.g., a personal camera, a head-mounted display, or a watch), a vehicle control system or console, a home appliance, a set top box, an entertainment unit, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 600 includes the processor 104, such as a digital signal processor (DSP), a central processing unit (CPU), a graphics processing unit (GPU), another processing device, or a combination thereof. The processor 104 includes the one or more registers 130, the memory storage circuitry 140, the fetch circuitry 150, and the SIMD processing pipeline 152. The one or more registers 110 store the first data vector 132, the second data vector 134, and the third data vector 136. The memory storage circuitry 140 includes the data vector analysis circuitry 142, the write circuitry 144, and the offset determination circuitry 146. The processor 104 may operate in a substantially similar manner as described with respect to FIG. 1.

The electronic device 600 may further include the memory 102. The memory 102 may be coupled to or integrated within the processor 104. The memory 102 may include random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), one or more registers, a hard disk, a removable disk, a compact disc read-only memory (CD-ROM), another storage device, or a combination thereof. The memory 102 may store the scatter instruction 106, the parallel-prefix valid count instruction 108, and one or more other instructions 668 executable by the processor 610. For example, the processor 104 may execute the scatter instruction 106 to store valid data values (of the data vectors 132, 134, 136) in the compressed memory data vector 110. The processor 104 may also execute the parallel-prefix valid count instruction 108 to determine the offset for each data vector 132, 134, 136 with respect to the compressed memory data vector 110. The processor 104 may also execute the one or more other instructions 668 to perform the method 500 of FIG. 5.

FIG. 6 also shows a display controller 626 that is coupled to the processor 104 and to a display 628. A coder/decoder (CODEC) 634 can also be coupled to the processor 104. A speaker 636 and a microphone 638 can be coupled to the CODEC 634. FIG. 6 also indicates that a wireless interface 640, such as a wireless controller and/or a transceiver, can be coupled to the processor 104 and to an antenna 642.

In a particular example, the processor 104, the display controller 626, the memory 102, the CODEC 634, and the wireless interface 640 are included in a system-in-package or system-on-chip device 622. Further, an input device 630 and a power supply 644 may be coupled to the system-on-chip device 622. Moreover, in a particular example, as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as to an interface or to a controller.

In connection with the disclosed examples, a computer-readable medium (e.g., the memory 102) stores instructions that are executable by a processor (e.g., the processor 104) to perform operations. The operations include storing first valid data at a first memory address of a memory. The first valid data may be located at a first particular position of a first data vector that includes valid data and invalid data. The first particular position may be associated with valid data. The operations also include determining whether the first data vector includes another position associated with valid data. If the first data vector includes another position associated with valid data, the operations include storing the valid data located at the other position at a second memory address that is contiguous to the first memory address. The operations also include storing second valid data at the second memory address if the first data vector does not include another position associated with valid data. The second data may be located at a second particular position of a second data vector that includes valid data and invalid data. The second particular position may be associated with valid data.

In conjunction with the described techniques, an apparatus includes means for determining a first offset associated with a first valid position in a sequence of data elements via execution of a parallel-prefix valid count instruction. The sequence of data elements may include valid data and invalid data. For example, the means for determining the first offset may include the memory storage circuitry 140 of FIGS. 1 and 6, the data vector analysis circuitry 142 of FIGS. 1 and 6, the offset determination circuitry 146 of FIGS. 1 and 6, the processor 104 of FIGS. 1 and 6, one or more other devices, circuits, modules, or any combination thereof.

The apparatus may also include means for determining a second offset associated with a second valid position in the sequence of data elements via execution of the parallel-prefix valid count instruction. The second offset may be based on the first offset and a number of positions in the sequence of data elements that are associated with valid data. For example, the means for determining the second offset may include the memory storage circuitry 140 of FIGS. 1 and 6, the data vector analysis circuitry 142 of FIGS. 1 and 6, the offset determination circuitry 146 of FIGS. 1 and 6, the processor 104 of FIGS. 1 and 6, one or more other devices, circuits, modules, or any combination thereof.

The foregoing disclosed devices and functionalities may be designed and represented using computer files (e.g. RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices, such as the electronic device 600 of FIG. 6.

Those of skill would further appreciate that the various illustrative logical blocks, configurations, modules, circuits, and algorithm steps described in connection with the implementations disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A method comprising:
at a single-instruction-multiple-data (SIMD) processor:
executing, during a particular clock cycle of the SIMD processor, a parallel-prefix valid count instruction to:
determine a first offset associated with a first valid position in a first vector that includes valid data and invalid data; and
determine a second offset associated with a second valid position in a second vector, the second offset based on the first offset and further based on a number of positions in the second vector that are associated with valid data.

2. The method of claim 1, wherein the first offset is determined in parallel with the second offset.

3. The method of claim 1, further comprising adding the number of positions between the first valid position and the second valid position that are associated with valid data to the first offset to compute the second offset.

4. The method of claim 1, further comprising:
storing first valid data from the first vector at a first memory address of a memory, the first memory address based on the first offset; and
storing second valid data from the second vector at a particular memory address of the memory, the particular memory address based on the second offset.

5. The method of claim 4, further comprising storing additional valid data from the first vector at additional sequential memory addresses that are contiguous to the first memory address of the memory.

6. The method of claim 5, wherein the particular memory address is contiguous to a last memory address of the additional sequential memory addresses.

7. The method of claim 4, wherein the first valid data and the second valid data are stored in parallel.

8. The method of claim 7, wherein storing the second valid data in parallel with the first valid data includes:
storing the first valid data during a first time period; and
concurrently storing the second valid data during the first time period.

9. The method of claim 4, wherein the first memory address and the particular memory address are memory addresses of a compressed memory data vector.

10. The method of claim 9, further comprising fetching data stored at the compressed memory data vector.

11. The method of claim 10, further comprising processing the data stored at the compressed memory data vector in response to fetching the data stored at the compressed memory data vector.

12. The method of claim 11, further comprising, after processing the data stored at the compressed memory data vector:
executing the parallel-prefix valid count instruction to determine offsets that map positions of processed data in contiguous memory to positions of valid data in a sparse sequence of data; and
loading the processed data from the contiguous memory to the positions of valid data in the sparse sequence of data.

13. The method of claim 1, further comprising:
sending a compressed vector to be stored at addresses of a memory that are based on the first offset and the second offset, the compressed vector including the valid data of the first vector and second valid data of the second vector;
in response to executing a gather instruction, receiving the compressed vector from the memory; and
decompressing the compressed vector based on the first offset and the second offset.

14. An apparatus comprising:
a memory; and
a single-instruction-multiple-data (SIMD) processor configured to execute, during a particular clock cycle of the SIMD processor, a parallel-prefix valid count instruction to:
determine a first offset associated with a first valid position in a first vector that includes valid data and invalid data; and
determine a second offset associated with a second valid position in a second vector, the second offset based on the first offset and a number of positions in the second vector that are associated with valid data.

15. The apparatus of claim 14, wherein the SIMD processor is further configured to determine the first offset in parallel with the second offset.

16. The apparatus of claim 14, wherein the SIMD processor is further configured to add the number of positions between the first valid position and the second valid position that are associated with valid data to the first offset to compute the second offset.

17. The apparatus of claim 14, wherein the SIMD processor is further configured to:
store first valid data from the first vector at a first memory address of the memory, the first memory address based on the first offset; and store second valid data from the second vector at a particular memory address of the memory, the particular memory address based on the second offset.

18. The apparatus of claim 17, wherein the SIMD processor is further configured to store additional valid data from the first vector at additional sequential memory addresses that are contiguous to the first memory address of the memory.

19. The apparatus of claim 18, wherein the particular memory address is contiguous to a last memory address of the additional sequential memory addresses.

20. The apparatus of claim 17, wherein the SIMD processor is further configured to store the first valid data and the second valid data to the memory in parallel.

21. The apparatus of claim 17, wherein the first memory address and the particular memory address are memory addresses of a compressed memory data vector.

22. The apparatus of claim 21, wherein the SIMD processor is further configured to fetch data stored at the compressed memory data vector.

23. A non-transitory computer-readable medium comprising at least one instruction that, when executed by a single-instruction-multiple-data (SIMD) processor, causes the SIMD processor to perform operations comprising:

determining, by execution of a parallel-prefix valid count instruction during a particular clock cycle of the SIMD processor, a first offset associated with a first valid position in a first vector that includes valid data and invalid data; and determining, by execution of the parallel-prefix valid count instruction during the particular clock cycle of the SIMD processor, a second offset associated with a second valid position in a second vector, the second offset based on the first offset and a number of positions in the second vector that are associated with valid data.

24. The non-transitory computer-readable medium of claim 23, wherein the first offset is determined in parallel with the second offset.

25. The non-transitory computer-readable medium of claim 23, wherein the operations further comprise adding the number of positions between the first valid position and the second valid position that are associated with valid data to the first offset to compute the second offset.

26. The non-transitory computer-readable medium of claim 23, wherein the operations further comprise:

storing first valid data from the first vector at a first memory address of a memory, the first memory address based on the first offset; and storing second valid data from the second vector at a particular memory address of the memory, the particular memory address based on the second offset.

27. The non-transitory computer-readable medium of claim 26, wherein the operations further comprise storing additional valid data from the first vector at additional sequential memory addresses that are contiguous to the first memory address of the memory.

28. An apparatus comprising:

means for storing data; and means for performing single-instruction-multiple-data (SIMD) operations, for determining, during a particular clock cycle, a first offset associated with a first valid position in a first vector via execution of a parallel-prefix valid count instruction, the first vector including valid data and invalid data, and for determining, during the particular clock cycle, a second offset associated with a second valid position in a second vector via execution of the parallel-prefix valid count instruction, the second offset based on the first offset and a number of positions in the second vector that are associated with valid data.

29. The apparatus of claim 28, wherein the means for performing SIMD operations is configured to determine the first offset in parallel with the second offset.

30. The apparatus of claim 28, wherein the means for performing SIMD operations is configured to determine the second offset by adding the number of positions between the first valid position and the second valid position that are associated with valid data to the first offset.

* * * * *